United States Patent
Sandhu et al.

(10) Patent No.: US 6,727,173 B2
(45) Date of Patent: *Apr. 27, 2004

(54) SEMICONDUCTOR PROCESSING METHODS OF FORMING AN UTILIZING ANTIREFLECTIVE MATERIAL LAYERS, AND METHODS OF FORMING TRANSISTOR GATE STACKS

(75) Inventors: Gurtej S. Sandhu; Sujit Sharan, both of Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/891,570

(22) Filed: Jun. 25, 2001

(65) Prior Publication Data

US 2001/0044221 A1 Nov. 22, 2001

Related U.S. Application Data

(63) Continuation of application No. 09/146,841, filed on Sep. 3, 1998, now Pat. No. 6,268,282.

(51) Int. Cl.[7] .......................................... H01L 21/4763
(52) U.S. Cl. .................. 438/636; 438/585; 438/645
(58) Field of Search ................... 438/636, 645, 438/787, 788; 257/758

(56) References Cited

U.S. PATENT DOCUMENTS

| | | |
|---|---|---|
| 4,158,717 A | 6/1979 | Nelson |
| 4,444,617 A | 4/1984 | Whitcomb |
| 4,474,975 A | 10/1984 | Clemons et al. |
| 4,552,783 A | 11/1985 | Stoll et al. |
| 4,562,091 A | 12/1985 | Sachdev et al. |
| 4,600,671 A | 7/1986 | Saitoh et al. |
| 4,648,904 A | 3/1987 | DePasquale et al. |
| 4,695,859 A | 9/1987 | Guha et al. |

(List continued on next page.)

FOREIGN PATENT DOCUMENTS

| | | |
|---|---|---|
| EP | 0 464515 A3 | 1/1992 |
| EP | 0 471 185 | 2/1992 |
| EP | 0 588 087 A2 A3 | 3/1994 |

(List continued on next page.)

OTHER PUBLICATIONS

Text: Wolf, S. et al., "Silicon Processing for the VLSI Era", vol. 1, pp. 437–441.

McKenzie, D.R. et al., "New Technology for PACVD", Surface and Coatings Technology, vol. 82, pp. 326–333 (1996).

(List continued on next page.)

Primary Examiner—Richard Elms
Assistant Examiner—Brad Smith
(74) Attorney, Agent, or Firm—Wells St. John P.S.

(57) ABSTRACT

In one aspect, the invention includes a semiconductor processing method comprising exposing silicon, nitrogen and oxygen in gaseous form to a high density plasma during deposition of a silicon, nitrogen and oxygen containing solid layer over a substrate. In another aspect, the invention includes a gate stack forming method, comprising: a) forming a polysilicon layer over a substrate; b) forming a metal silicide layer over the polysilicon layer; c) depositing an antireflective material layer over the metal silicide utilizing a high density plasma; d) forming a layer of photoresist over the antireflective material layer; e) photolithographically patterning the layer of photoresist to form a patterned masking layer from the layer of photoresist; and f) transferring a pattern from the patterned masking layer to the antireflective material layer, metal silicide layer and polysilicon layer to pattern the antireflective material layer, metal silicide layer and polysilicon layer into a gate stack.

18 Claims, 3 Drawing Sheets

U.S. PATENT DOCUMENTS

| | | |
|---|---|---|
| 4,702,936 A | 10/1987 | Maeda et al. |
| 4,755,478 A | 7/1988 | Abernathey et al. |
| 4,764,247 A | 8/1988 | Leveriza et al. |
| 4,805,683 A | 2/1989 | Magdo et al. |
| 4,833,096 A | 5/1989 | Huang et al. |
| 4,863,755 A | 9/1989 | Hess et al. |
| 4,870,470 A | 9/1989 | Bass, Jr. et al. |
| 4,910,160 A | 3/1990 | Jennings et al. |
| 4,940,509 A | 7/1990 | Tso et al. |
| 4,954,867 A | 9/1990 | Hosaka |
| 4,992,306 A | 2/1991 | Hochberg et al. |
| 5,034,348 A | 7/1991 | Hartswick et al. |
| 5,061,509 A | 10/1991 | Naito et al. |
| 5,140,390 A | 8/1992 | Li et al. |
| 5,219,613 A | 6/1993 | Fabry et al. |
| 5,234,869 A | 8/1993 | Mikata et al. |
| 5,244,537 A | 9/1993 | Ohnstein |
| 5,260,600 A | 11/1993 | Harada |
| 5,270,267 A | 12/1993 | Ouellet |
| 5,286,661 A | 2/1994 | de Fresart et al. |
| 5,302,366 A | 4/1994 | Schuette et al. |
| 5,312,768 A | 5/1994 | Gonzalez |
| 5,314,724 A | 5/1994 | Tsukune et al. |
| 5,340,621 A | 8/1994 | Matsumoto et al. |
| 5,356,515 A | 10/1994 | Tahara et al. |
| 5,376,591 A | 12/1994 | Maeda et al. |
| 5,405,489 A | 4/1995 | Kim et al. |
| 5,413,963 A | 5/1995 | Yen et al. |
| 5,429,987 A | 7/1995 | Allen |
| 5,439,838 A | 8/1995 | Yang |
| 5,441,797 A | 8/1995 | Hogan et al. |
| 5,461,003 A | 10/1995 | Havemann et al. |
| 5,470,772 A | 11/1995 | Woo |
| 5,472,827 A | 12/1995 | Ogawa et al. |
| 5,472,829 A | 12/1995 | Ogawa |
| 5,482,894 A | 1/1996 | Havemann |
| 5,498,555 A | 3/1996 | Lin |
| 5,536,857 A | 7/1996 | Narula et al. |
| 5,541,445 A | 7/1996 | Quellet |
| 5,543,654 A | 8/1996 | Dennen |
| 5,554,567 A | 9/1996 | Wang |
| 5,591,494 A | 1/1997 | Sato et al. |
| 5,591,566 A | 1/1997 | Ogawa |
| 5,600,165 A | 2/1997 | Tsukamoto et al. |
| 5,639,687 A | 6/1997 | Roman et al. |
| 5,641,607 A | 6/1997 | Ogawa et al. |
| 5,648,202 A | 7/1997 | Ogawa et al. |
| 5,652,187 A | 7/1997 | Kim et al. |
| 5,656,330 A | 8/1997 | Niiyama et al. |
| 5,656,337 A | 8/1997 | Park et al. |
| 5,661,093 A | 8/1997 | Ravi et al. |
| 5,667,015 A | 9/1997 | Harestad et al. |
| 5,670,297 A | 9/1997 | Ogawa et al. |
| 5,674,356 A | 10/1997 | Nagayama |
| 5,677,015 A | 10/1997 | Hasegawa |
| 5,677,111 A | 10/1997 | Ogawa |
| 5,691,212 A | 11/1997 | Tsai et al. |
| 5,698,352 A | 12/1997 | Ogawa et al. |
| 5,709,741 A | 1/1998 | Akamatsu et al. |
| 5,710,067 A | 1/1998 | Foote et al. |
| 5,731,242 A | 3/1998 | Parat et al. |
| 5,741,721 A | 4/1998 | Stevens |
| 5,744,399 A | 4/1998 | Rostoker et al. |
| 5,747,388 A | 5/1998 | Kusters et al. |
| 5,750,442 A | 5/1998 | Juengling |
| 5,753,320 A | 5/1998 | Mikoshiba et al. |
| 5,759,755 A | 6/1998 | Park et al. |
| 5,783,493 A | 7/1998 | Yeh et al. |
| 5,786,039 A | 7/1998 | Brouquet |
| 5,792,689 A | 8/1998 | Yang et al. |
| 5,800,877 A | 9/1998 | Maeda et al. |
| 5,801,399 A | 9/1998 | Hattori et al. |
| 5,807,660 A | 9/1998 | Lin et al. |
| 5,817,549 A | 10/1998 | Yamazaki et al. |
| 5,831,321 A | 11/1998 | Nagayama |
| 5,838,052 A | 11/1998 | McTeer |
| 5,858,880 A | 1/1999 | Dobson et al. |
| 5,872,035 A | 2/1999 | Kim et al. |
| 5,872,385 A | 2/1999 | Taft et al. |
| 5,874,367 A | 2/1999 | Dobson |
| 5,883,011 A | 3/1999 | Lin et al. |
| 5,883,014 A | 3/1999 | Chen et al. |
| 5,933,721 A | 8/1999 | Hause et al. |
| 5,948,482 A | 9/1999 | Brinker et al. |
| 5,960,289 A | 9/1999 | Tsui et al. |
| 5,962,581 A | 10/1999 | Hayase et al. |
| 5,968,324 A | 10/1999 | Cheung et al. |
| 5,968,611 A | 10/1999 | Kaloyeros et al. |
| 5,981,368 A | 11/1999 | Gardner et al. |
| 5,985,519 A | 11/1999 | Kakamu et al. |
| 5,986,318 A | 11/1999 | Kim et al. |
| 5,994,217 A | 11/1999 | Ng |
| 5,994,730 A | 11/1999 | Shrivastava et al. |
| 6,001,741 A | 12/1999 | Alers |
| 6,001,747 A | 12/1999 | Annapragada |
| 6,004,850 A | 12/1999 | Lucas et al. |
| 6,008,121 A | 12/1999 | Yang et al. |
| 6,008,124 A | 12/1999 | Sekiguchi et al. |
| 6,017,779 A | 1/2000 | Miyasaka |
| 6,020,243 A | 2/2000 | Wallace et al. |
| 6,022,404 A | 2/2000 | Ettlinger et al. |
| 6,028,015 A | 2/2000 | Wang et al. |
| 6,030,901 A | 2/2000 | Hopper et al. |
| 6,040,619 A | 3/2000 | Wang et al. |
| 6,054,379 A | 4/2000 | Yau et al. |
| 6,060,765 A | 5/2000 | Maeda |
| 6,060,766 A | 5/2000 | Mehta et al. |
| 6,071,799 A | 6/2000 | Park et al. |
| 6,072,227 A | 6/2000 | Yau et al. |
| 6,087,064 A | 7/2000 | Lin et al. |
| 6,087,267 A | 7/2000 | Dockrey et al. |
| 6,096,656 A | 8/2000 | Matzke et al. .............. 438/702 |
| 6,114,255 A | 9/2000 | Juengling |
| 6,130,168 A | 10/2000 | Chu et al. |
| 6,133,096 A | 10/2000 | Su et al. |
| 6,133,613 A | 10/2000 | Yao et al. |
| 6,133,618 A | 10/2000 | Steiner |
| 6,136,636 A | 10/2000 | Wu |
| 6,140,151 A | 10/2000 | Akram |
| 6,140,677 A | 10/2000 | Gardner et al. |
| 6,143,670 A | 11/2000 | Cheng et al. |
| 6,156,674 A | 12/2000 | Li et al. |
| 6,159,804 A | 12/2000 | Gardner et al. |
| 6,159,871 A | 12/2000 | Loboda et al. |
| 6,184,151 B1 | 2/2001 | Adair et al. |
| 6,184,158 B1 | 2/2001 | Shufflebotham et al. .... 438/788 |
| 6,187,657 B1 | 2/2001 | Xiang et al. |
| 6,187,694 B1 | 2/2001 | Cheng et al. |
| 6,198,144 B1 | 3/2001 | Pan et al. |
| 6,200,835 B1 | 3/2001 | Manning |
| 6,204,168 B1 | 3/2001 | Naik et al. |
| 6,209,484 B1 | 4/2001 | Huang et al. ............ 118/723 E |
| 6,225,217 B1 | 5/2001 | Usami et al. |
| 6,235,568 B1 | 5/2001 | Murthy et al. |
| 6,235,591 B1 | 5/2001 | Balasubramanian et al. |
| 6,238,976 B1 | 5/2001 | Noble et al. |
| 6,268,282 B1 * | 7/2001 | Sandhu et al. .............. 438/636 |
| 6,274,292 B1 | 8/2001 | Holscher et al. |
| 6,281,100 B1 | 8/2001 | Yin et al. |
| 6,323,101 B1 | 11/2001 | Li et al. |
| 6,373,114 B1 | 4/2002 | Jeng et al. |

| | | |
|---|---|---|
| 6,403,464 B1 | 6/2002 | Chang |
| 6,429,115 B1 | 8/2002 | Tsai et al. |
| 6,435,943 B1 | 8/2002 | Chang et al. |
| 6,436,808 B1 | 8/2002 | Ngo et al. |
| 6,440,860 B1 | 8/2002 | DeBoer et al. |
| 6,444,593 B1 | 9/2002 | Ngo et al. |
| 6,465,372 B1 | 10/2002 | Xia et al. |
| 6,486,057 B1 | 11/2002 | Yeh et al. |
| 6,486,061 B1 | 11/2002 | Xia et al. |
| 6,492,688 B1 | 12/2002 | Ilg |
| 6,503,818 B1 | 1/2003 | Jang |
| 6,518,122 B1 | 2/2003 | Chan et al. |
| 2001/0003064 A1 | 6/2001 | Ohto |
| 2001/0019868 A1 | 9/2001 | Gonzalez et al. |
| 2001/0038919 A1 | 11/2001 | Berry, III et al. |
| 2002/0033486 A1 | 3/2002 | Kim et al. |
| 2002/0081834 A1 | 6/2002 | Daniels et al. |
| 2003/0013311 A1 | 1/2003 | Chang et al. |

FOREIGN PATENT DOCUMENTS

| | | |
|---|---|---|
| EP | 0 771886 A1 | 5/1997 |
| EP | 0 778 496 | 6/1997 |
| EP | 0 942330 | 9/1999 |
| EP | 1 172 845 A2 | 1/2002 |
| GB | 593727 | 10/1947 |
| JP | 63-157443 | 6/1988 |
| JP | 6-067019 | 1/1992 |
| JP | 5-263255 | 10/1993 |
| JP | 6-232113 | 8/1994 |
| JP | 6-244172 | 9/1994 |
| JP | 7-201716 | 8/1995 |
| JP | 8-46186 | 2/1996 |
| JP | 8-46188 | 2/1996 |
| JP | 8-213386 A | 8/1996 |
| JP | 9-50993 | 2/1997 |
| JP | 09 055 351 | 2/1997 |
| JP | 2000068261 A | 3/2000 |
| TW | 368687 A | 9/1999 |
| TW | 420844 A | 2/2001 |
| TW | 429473 A | 4/2001 |
| WO | PCT/US99/20030 | 8/1999 |
| WO | PCT/US99/20039 | 8/1999 |

OTHER PUBLICATIONS

Shibata, N., "Plasma–Chemical Vapor–Deposited Silicon Oxide/Silicon Oxynitride Double–Layer Antireflective Coating for Solar Cells", Japanese Jour. of App. Physics, vol. 30, No. 5, May 1991, pp. 997–1001.

Article: Bencher, C. et al., "Dielectric antireflective coatings for DUV lithography", Solid State Technology (Mar. 1997), pp. 109–114.

Article: Dammel, R. R. et al., "Dependence of Optical Constants of AZ® BARLi™ Bottom Coating on Back Conditions", SPIE vol. 3049 (1977), pp. 963–973.

Text: Heavens, O. S., "Optical Properties of Thin Solid Films", pp. 48–49.

Text: Jenkins, F. et al., "Fundamentals of Optics", Properties of Light, pp. 9–10.

U.S. application No. 09/030,618, filed Feb. 1998, Holscher.

Wolf, S., "Silicon Processing for the VLSI Era", vol. 2: Process Integration, Lattice Press 1986, pp. 48–49 and 435.

Wolf, S., "Silicon Processing for the VLSI Era", vol. 1: Process Technology, Lattice Press 1986, pp. 407–413.

Withmall, R. et al., "Matrix Reactions of Methylsilanes and Oxygen Atoms", The Journal of Physical Chemistry, vol. 92, No. 3, 1998, pp. 594–602.

Weidman, T. et al., "New Photodefinable Glass Etch Masks for Entirely Dry Photolithography: Plasma Deposited Organosilicon Hydride Polymers", Appl. Phys. Lett., vol. 62, No. 4, Jan. 25, 1993, pp. 372–374.

Weidman, T. et al., "All Dry Lithography: Applications of Plasma Polymerized Methylsilane as a Single Layer Resist and Silicon Dioxide Precursor", J. Photopolym. Sci. Technol., vol. 8, No. 4, 1995, pp. 679–686.

Joubert, O. et al., "Application of Plasma Polymerized Methylsilane in an All Dry Resist Process for 193 and 248nm Lithography", Microelectronic Engineering 30 (1996), pp. 275–278.

Joshi, A. et al., "Plasma Deposited Organosilicon Hydride Network Polymers as Versatile Resists for Entirely Dry Mid–Deep UV Photolithography", SPIE vol. 1925 (1993), pp. 709–720.

Matsura, M. et al., "A Highly Reliable Swlf–Planarizing Low–k Intermetal Dielectric for Sub–quarter Micron Interconnects, IEEE IEDM Tech. Dig., 1997, pp. 785–788.

Horie, O. et al., "Kinetics and Mechanism of the Reactions of O($^3$P) with $SiH_4$, $CH_3SiH_3$, $(CH_3)_2SiH_2$, and $(CH_3)_3SiH$", J. Phys. Chem. 1991, vol. 95, pp. 4393–4400.

McClatchie, S. et al., "Low Dielectric Constant Flowfill" Technology for IMD Applications", Proeed. of 3d Internatl. Dielectrics for ULSI Multilevel Interconnection Conf, Santa Clara, CA, Feb 1997, pp, 34–40.

Beekman, K. et al., "Sub–Micron Gap Fill and In–Situ Planarisation Using Flowfill™ Technology", ULSI Conf, Portland, OR, Oct. 1995, pp. 1–7.

Kiermasz, A. et al., "Planarisation for Sub–Micron Devices Utilising a New Chemistry", DUMIC Conf., California, Feb. 1995, pp. 1–2.

IBM Technical Disclosure Bulletin, "Low–Temperature Deposition of $SiO_2$, $Si_3N_4$ or $SiO_2$–$Si_3N_4$", vol. 28, Iss. 9, p. 4170 (Feb. 1986).

TEXT: Ralls, K. et al., "Introduction to Materials Science and Engineering", 1976 John Wiley & Sons, Inc., pp. 312–313.

ABSTRACT: Loboda, M. et al., "Using Trimethylsilane to Improve Safety, Throughput and Versatility in PECVD Processes", Electrochemical Society Meeting Abstract No. 358, 191$^{st}$ meeting, Montreal, Quebec, vol. MA 97–1, 1997, p. 454.

Laxman, R. et al., "Synthesizing Los–K CVD Materials for Fab Use", Semiconductor Internatl., Nov. 2000, pp. 95–102 (printed from www.semiconductor–intl.com).

Anonymous, "New Gas Helps Make Faster ICs", Machine Design, vol. 71, Iss. 21, Nov. 4, 1999, p. 118.

Grant, J., "Hackh's Chemical Dictionary", McGraw–Hill, Inc. 1969, Fourth Edition, p. 27.

App. 09/234,233, Li et al., filed Jan. 1999.

App. 09/773,462, Rolfson et al., filed Jan. 31, 2001.

Wolf, S., "Silicon Processing for the VLSI Era", vol. 1, Lattice Press 1985, Prologue p. xxiii.

Wolf, S., "Silicon Processing for the VLSI Era", vol. 1: Process Technology, Lattice Press 1986, pp. 189–190.

* cited by examiner

SEMICONDUCTOR PROCESSING METHODS OF FORMING AN UTILIZING ANTIREFLECTIVE MATERIAL LAYERS, AND METHODS OF FORMING TRANSISTOR GATE STACKS

This patent resulted from a continuation application of U.S. patent application Ser. No. 09/146,841, filed on Sep. 3, 1998, which issued as U.S. Pat. No. 6,268,282, on Jul. 31, 2001.

TECHNICAL FIELD

The invention pertains to methods of forming and utilizing antireflective material layers, and to methods of forming transistor gate stacks.

BACKGROUND OF THE INVENTION

Semiconductor processing frequently involves providing a photoresist layer over a substrate. Portions of the photoresist layer are subsequently exposed to light through a masked light source. The mask contains clear and opaque regions defining a pattern to be created in the photoresist layer. Regions of the photoresist layer which are exposed to light are made either soluble or insoluble in a solvent. If the exposed regions are soluble, a positive image of the mask is produced in the photoresist. The photoresist is therefore termed a positive photoresist. On the other hand, if the non-irradiated regions are dissolved by the solvent, a negative image results. Hence, the photoresist is referred to as a negative photoresist.

A difficulty that can occur when exposing photoresist to radiation is that waves of radiation can propagate through the photoresist to a layer beneath the photoresist and then be reflected back up through the photoresist to interact with other waves propagating through the photoresist. The reflected waves can constructively and/or destructively interfere with other waves propagating through the photoresist to create periodic variations of light intensity within the photoresist. Such variations of light intensity can cause the photoresist to receive non-uniform doses of energy throughout its thickness. The non-uniform doses can decrease the accuracy and precision with which a masked pattern is transferred to the photoresist. Accordingly, it is desired to develop methods which suppress radiation waves from being reflected by layers beneath a photoresist layer.

A method which has been used with some success to suppress reflected waves is to form an antireflective material beneath a photoresist layer. Antireflective materials are typically materials which absorb radiation and thereby therefore quench reflection of the radiation. Antireflective materials absorb various wavelengths of radiation with varying effectiveness. The number of materials available for use as antireflective materials is limited. Accordingly, it is desired to develop alternative methods of varying the wavelengths absorbed, and effectiveness with which the wavelengths are absorbed, for antireflective materials.

A particular type of antireflective coating material is a deposited antireflective coating (DARC). An exemplary DARC is $Si_xO_yN_z$, wherein x is from about 40 to about 60, y is from about 29 to about 45, and z is from about 10 to about 16. The DARC can comprise, for example, $Si_{50}O_{37}N_{13}$. A DARC can be formed by, for example, chemical vapor deposition on a substrate at about 400° C. and under a pressure of from about 4 Torr to about 6.5 Torr, utilizing $SiH_4$ and $N_2O$ as precursors. The DARC material can be deposited either with or without a plasma being present in a reaction chamber during the deposition. A typical goal in utilizing a DARC film is to reduce reflected radiation reaching an overlying layer of photoresist to less than 10% of incident radiation at the DARC film.

Figure 1:
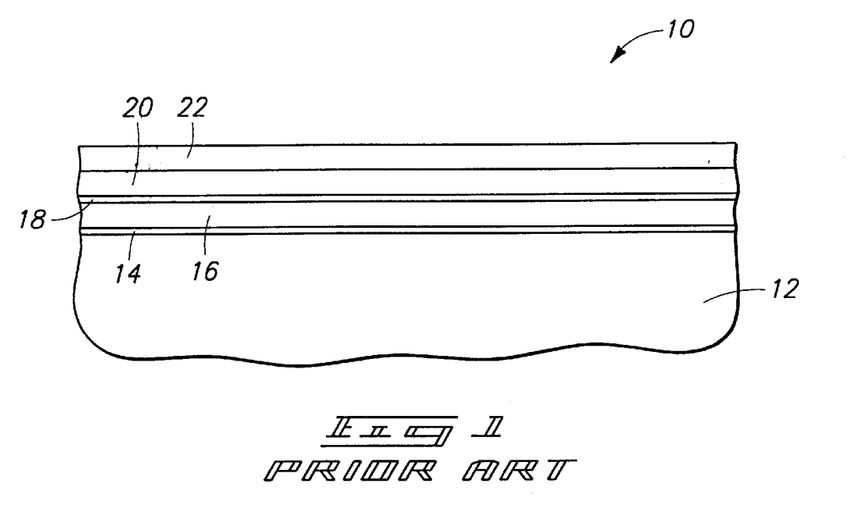
FIG. 1 is a fragmentary, diagrammatic, cross-sectional view of a prior art semiconductive wafer fragment.

A prior art process utilizing a DARC material is described with reference to a semiconductive wafer fragment 10 in FIG. 1. Wafer fragment 10 comprises a substrate 12. Substrate 12 can comprise, for example, monocrystalline silicon lightly doped with a background p-type dopant. To aid in interpretation of the claims that follow, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A gate dielectric layer 14, polysilicon layer 16, and silicide layer 18 are formed over substrate 12. Gate dielectric layer 14 can comprise, for example, silicon dioxide; polysilicon layer 16 can comprise, for example, conductively doped polysilicon; and silicide layer 18 can comprise, for example, tungsten silicide or titanium silicide. Layers 14, 16 and 18 are to be ultimately patterned into a transistor gate structure.

An antireflective coating layer 20 is provided over silicide layer 18, and a photoresist layer 22 is provided over antireflective coating layer 20. Antireflective coating layer 20 can comprise, for example, an inorganic layer such as $Si_xO_yN_2$. In practice the layer can be substantially inorganic, with the term "substantially inorganic" indicating that the layer can contain a small amount of carbon (less than 1%).

Silicide layer 18 is preferably subjected to an anneal to improve a crystalline structure and a conductivity of the silicide layer prior to utilization of the layer in a transistor gate. The anneal of silicide layer 18 can comprise, for example, a temperature of 850° C. and a pressure of 1 atmosphere for a time of 30 minutes.

DARC material 20 is typically provided over silicide layer 18 prior to the anneal to protect layer 18 from gaseous oxygen during the anneal. If gaseous oxygen interacts with layer 18 during the anneal, the oxygen can oxidize a portion of layer 18 and adversely effect conductivity of layer 18. Unfortunately, the anneal conditions can detrimentally influence optical properties of DARC material 20. Specifically, DARC material 20 has optical properties that can be described by a refractive index coefficient (n) and an extinction coefficient (energy absorption coefficient) (k). The anneal conditions which improve conductivity of silicide layer 18 can alter one or both of "n" and "k" of layer 20. A stoichiometry of the materials of layer 20 is typically carefully chosen to adjust "n" and "k" of the material to appropriate parameters which will substantially quench reflected radiation before the radiation reaches photoresist layer 22. The effect of the anneal conditions on "n" and "k" can push such parameters out of an optimum adjusted range. Accordingly, it is desired to develop methods of forming DARC materials wherein "n" and "k" of the materials will be resistant to anneal condition induced changes.

SUMMARY OF THE INVENTION

In one aspect, the invention encompasses a semiconductor processing method wherein silicon, nitrogen and oxygen in gaseous form are exposed to a high density plasma during deposition of a silicon, nitrogen and oxygen containing solid layer over a substrate.

In another aspect, the invention encompasses a semiconductor processing method of photolithographic processing. A metal silicide layer is formed over a substrate. An antireflective material layer is deposited over the metal silicide utilizing a high density plasma. A layer of photoresist is formed over the antireflective material layer. The layer of photoresist is photolithographically patterned.

In yet another aspect, the invention encompasses a transistor gate stack forming method. A polysilicon layer is formed over a substrate. A metal silicide layer is formed over the polysilicon layer. An antireflective material layer is deposited over the metal silicide utilizing a high density plasma. A layer of photoresist is formed over the antireflective material layer. The layer of photoresist is photolithographically patterned to form a patterned masking layer from the layer of photoresist. A pattern is transferred from the patterned masking layer to the antireflective material layer, metal silicide layer and polysilicon layer to pattern the antireflective material layer, metal silicide layer and polysilicon layer into a transistor gate stack.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 2:
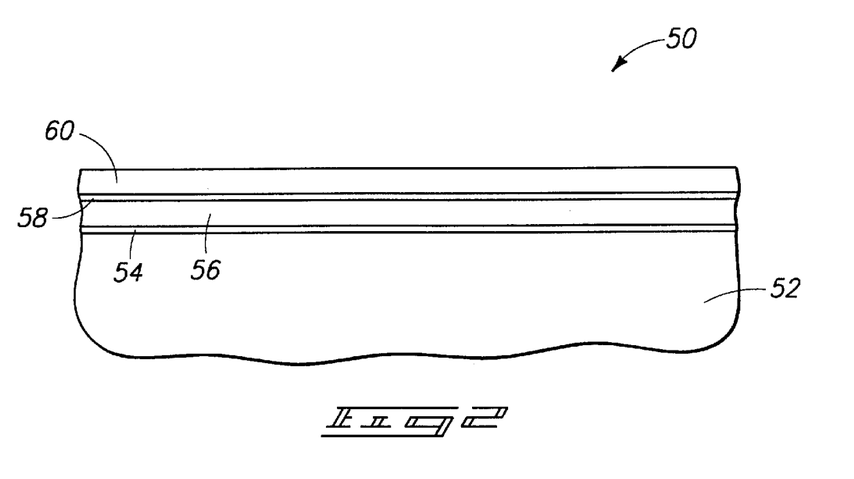
FIG. 2 is a fragmentary, diagrammatic, cross-sectional view of a semiconductive wafer fragment at a preliminary processing step of a method of the present invention.

FIG. 2 illustrates a semiconductive wafer fragment 50 at a preliminary processing step of an embodiment of the present invention. Wafer fragment 50 comprises a substrate 52, a gate dielectric layer 54, a polysilicon layer 56, and a silicide layer 58. Substrate 52, gate dielectric layer 54, polysilicon layer 56, and silicide layer 58 can comprise materials identical to those utilized in the prior art construction of FIG. 1 for substrate 12, gate dielectric layer 14, polysilicon layer 16 and silicide layer 18, respectively.

A DARC material layer 60 is formed over silicide layer 58. In contrast to prior art methods, DARC material 60 is formed using high density plasma deposition. Such deposition can occur within a reaction chamber. To aid in interpretation of the claims that follow, a "high density plasma" is defined as a plasma having a density of greater than or equal to $10^{10}$ ions/cm$^3$. The portion of wafer fragment 50 upon which layer 60 is deposited is preferably maintained at a temperature of from about 300° C. to about 800° C. during the deposition, with about 600° C. one preferred example. The temperature of wafer fragment 50 can be controlled by flowing helium against a backside of the wafer during the deposition to cool the wafer. At higher temperatures a denser layer 60 can be formed. Such denser layer 60 can be more stable to anneal conditions than a less dense layer 60. A preferred pressure range within a reaction chamber during deposition of layer 60 is from about 1 mTorr to 100 mTorr. Feed gases utilized in the high density plasma deposition can comprise $SiH_4$, $N_2$, $O_2$ and argon.

Figure 6:
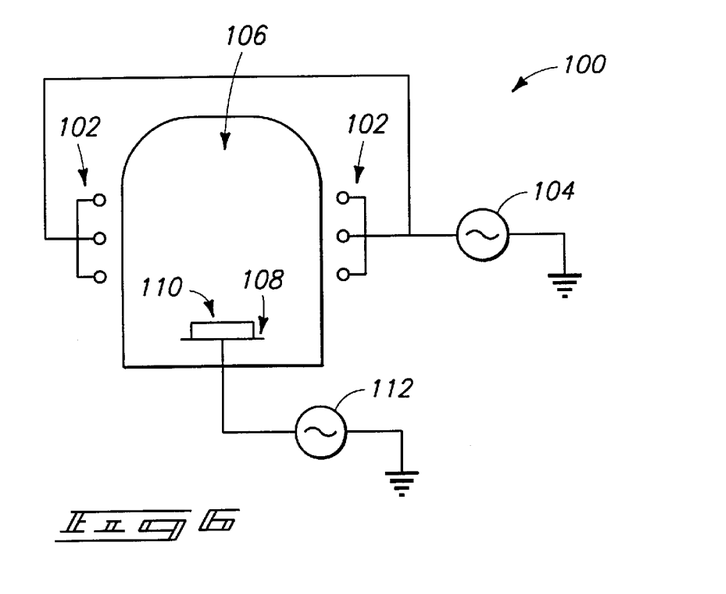
FIG. 6 is a diagrammatic, cross-sectional, schematic view of a reaction chamber which can be utilized in methods of the present invention.

An exemplary reaction chamber that can be utilized in a method of the present invention is shown schematically in FIG. 6 as part of a reactor 100. Reactor 100 comprises coils 102 connected to a power source 104. Coils 102 surround a reaction chamber 106 and are configured to generate a plasma within chamber 106. A wafer holder (chuck) 108 is provided within chamber 106, and holds a semiconductive wafer 110. Wafer holder 108 is electrically coupled to a power source 112. It is noted that power sources 104 and 112 can be separate power sources, or can comprise separate feeds originating from a single power source. The power from source 104 can be, for example, about 2000 watts and can comprise a frequency of about 13.6 megahertz. The power to wafer 110 from source 112 is preferably biased to less than or equal to about 200 watts and more preferably biased to about 100 watts. In practice, the bias power is typically measured at a chuck 108 holding wafer 110, rather than at wafer 110 itself.

An exemplary flow of the feed gases into reaction chamber 106 is $SiH_4$ (100 standard cubic centimeters per minute (sccm)), $N_2$ (150 sccm), $O_2$ (150 sccm), and argon (200 sccm).

During deposition of layer 60 (FIG. 2) onto a semiconductive wafer in a high pressure plasma process of the present invention, there will likely be both deposition and etch processes occurring simultaneously, resulting in a deposition-to-etch ratio. The deposition rate will exceed the etch rate, so a net effect is deposition of material onto the wafer. The rate of deposition can be calculated by providing no bias at the substrate during deposition, and the etch rate can be calculated by determining an etch rate when no deposition precursors are fed into reactor 106. Modification of the deposition-to-etch ratio by, for example, adjusting a bias power to substrate 110, can be utilized to affect the "n" and "k" values of a deposited layer 60 (FIG. 2).

Referring again to FIG. 2, silicide layer 58 is annealed after deposition of DARC material 60. The high pressure plasma deposition of the present invention can reduce variability of the optical properties (such as the "n" and "k" values) of material 60 during the anneal of suicide layer 58. For instance the variability of "n" and "k" induced by an anneal utilizing the conditions discussed in the "Background" section of this disclosure can be limited to changes of less than 10%.

Figure 3:
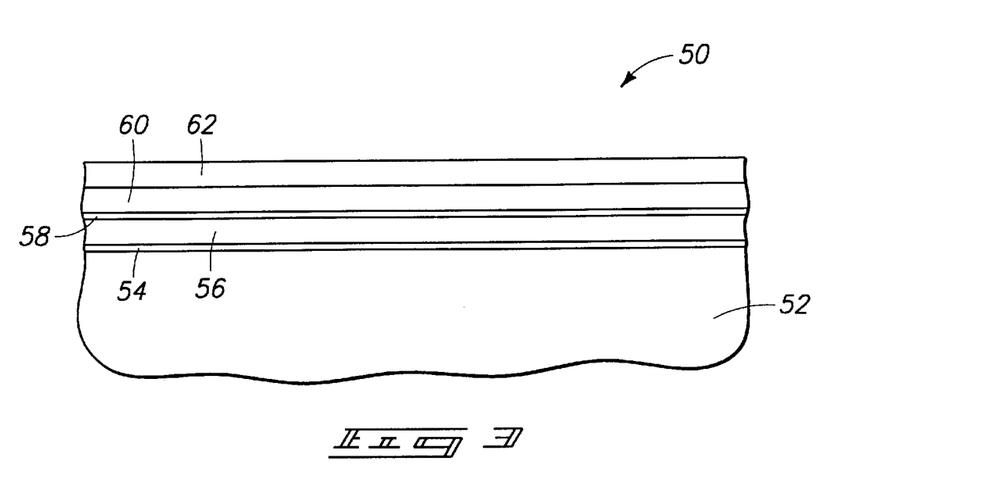
FIG. 3 is a view of the FIG. 2 wafer fragment at a processing step subsequent to that of FIG. 2.
Figure 4:
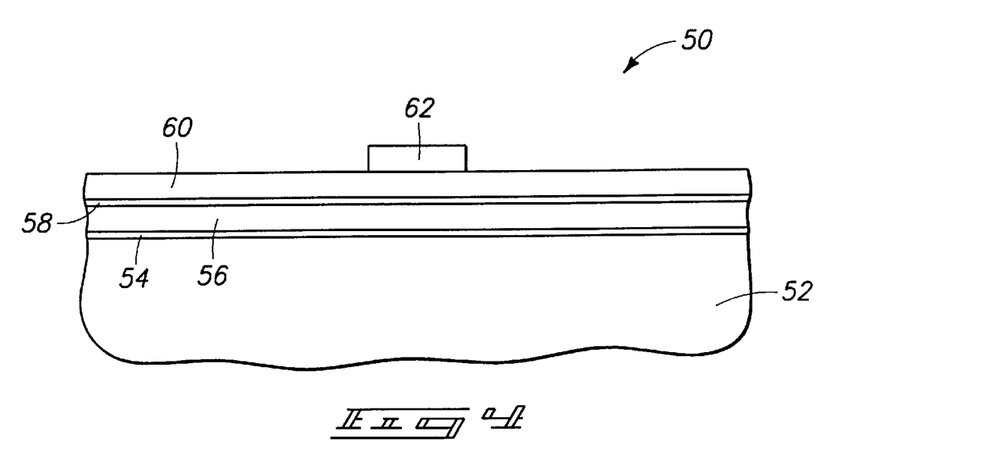
FIG. 4 is a view of the FIG. 2 wafer fragment at a processing step subsequent to that of FIG. 3.

Referring to FIG. 3, a photoresist layer 62 is formed over DARC material 60. Photoresist layer 62 is then patterned by exposure to a masked light source and a solvent to remove portions of layer 62 and form the resulting structure shown on FIG. 4.

Figure 5:
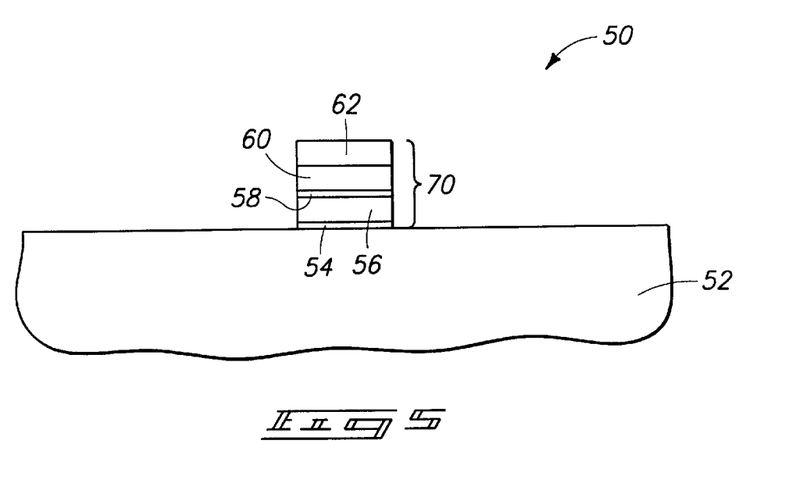
FIG. 5 is a view of the FIG. 2 wafer fragment at a processing step subsequent to that of FIG. 4.

A pattern is then transferred from layer 62 to underlying layers 54, 56, 58 and 60 to form a gate stack 70 shown in FIG. 5. It is noted that the application also encompasses embodiments wherein a gate stack encompasses layers 60, 58 and 56, and wherein layer 54 is not patterned. A method of transferring a pattern from photoresist layer 62 to underlying layers 54, 56, 58 and 60 is a plasma etch. After the formation of gate stack 70, photoresist layer 62 can be removed. Also, source and drain regions can be implanted adjacent gate stack 70 and sidewall spacers can be formed along sidewalls of gate stack 70 to form a transistor gate structure from the gate stack.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:
    depositing a material comprising Si, N and O over a substrate utilizing a feed gas comprising $SiH_4$, $N_2$ and $O_2$;
    exposing the material to a high density plasma during the depositing;
    forming a layer of photoresist over the material;
    photolithographically patterning the layer of photoresist; and
    wherein the deposition occurs at first temperature; further comprising exposing the material to a second temperature higher than the first temperature after the exposure of the material to the high density plasma; and wherein "n" and "k" values of the material change by less than 10% during the exposing to the second temperature.

2. The method of claim 1 wherein the second temperature is greater than 800° C.

3. The method of claim 1 wherein the second temperature is greater than 850° C.

4. A semiconductor processing method comprising:
    depositing a material comprising Si, N and O over a substrate utilizing a feed gas comprising $SiH_4$, $N_2$ and $O_2$;
    exposing the material to a high density plasma during the depositing;
    forming a layer of photoresist over the material;
    photolithographically patterning the layer of photoresist; and
    maintaining at least a portion of the substrate at a temperature of from about 300° C. to about 800° C. during the depositing.

5. A semiconductor processing method comprising:
    depositing a material comprising Si, N and O over a substrate utilizing a feed gas comprising $SiH_4$, $N_2$ and $O_2$;
    exposing the material to a high density plasma during the depositing;
    forming a layer of photoresist over the material;
    photolithographically patterning the layer of photoresist;
    wherein the depositing occurs in a reactor: and
    wherein a temperature within the reactor during the depositing is from about 300° C. to about 800° C.

6. A semiconductor processing method comprising:
    depositing a material comprising Si, N and O over a substrate utilizing a feed gas comprising $SiH_4$, $N_2$ and $O_2$;
    exposing the material to a high density plasma during the depositing;
    forming a layer of photoresist over the material;
    photolithographically patterning the layer of photoresist;
    wherein the depositing occurs in a reactor; and
    wherein a pressure within the reactor during the depositing is from about 1 mTorr to about 100 mTorr.

7. A semiconductor processing method comprising:
    depositing a material comprising Si, N and O over a substrate utilizing a feed gas comprising $SiH_4$, $N_2$ and $O_2$;
    exposing the material to a high density plasma during the depositing;
    forming a layer of photoresist over the material;
    photolithographically patterning the layer of photoresist;
    wherein the depositing occurs in a reactor;
    wherein the substrate is biased to a power of about 100 watts during the depositing; and
    wherein the plasma is induced at a power of about 2000 watts.

8. A semiconductor processing method comprising:
    depositing a material comprising Si, N and O over a substrate utilizing a feed gas comprising $SiH_4$, $N_2$ and $O_2$;
    exposing the material to a high density plasma during the depositing;
    forming a layer of photoresist over the material;
    photolithographically patterning the layer of photoresist;
    wherein the depositing occurs in a reactor;
    wherein a temperature within the reactor during the depositing is from about 300° C. to about 800° C.; and
    wherein a pressure within the reactor during the depositing is from about 1 mTorr to about 100 mTorr.

9. A material comprising silicon, nitrogen and oxygen, and having "n" and "k" values which change by less than 10% during exposure of the material to a temperature of at least about 850° C.

10. The material of claim 9 formed over metal silicide.

11. The material of claim 9 formed over and physically against metal silicide.

12. The material of claim 9 formed on metal silicide, and wherein the metal silicide is over a monocrystalline silicon substrate.

13. The material of claim 9 wherein the temperature is comprised by anneal conditions which include an exposure time to the temperature of at least about 30 minutes.

14. The material of claim 9 wherein the temperature is comprised by anneal conditions which include a pressure of at least about 1 atmosphere and an exposure time to the temperature of at least about 30 minutes.

15. A semiconductor processing method comprising:
    forming a layer comprising silicon, nitrogen and oxygen; the layer being characterized by an "n" value and a "k" value;
    exposing the deposited layer to a temperature of at least about 850° C.; and
    the "n" and "k" values change by less than 10% during exposure to the temperature conditions.

16. The method of claim 15 comprising exposing the layer to a high density plasma prior to exposing the layer to the temperature.

17. The method of claim 15 wherein the duration of the exposure to the temperature is at least bout 30 minutes.

18. A semiconductor processing method comprising:

forming a metal silicide layer over a monocrystalline silicon substrate;

depositing an antireflective material layer over the metal silicide layer;

exposing the antireflective material layer to a high density plasma during the depositing;

forming a layer of photoresist over the antireflective material layer;

photolithographically patterning the layer of photoresist; and while the antireflective material layer is over the metal silicide layer, annealing the metal silicide layer.

* * * * *

UNITED STATES PATENT AND TRADEMARK OFFICE
CERTIFICATE OF CORRECTION

PATENT NO. : 6,727,173 B2
DATED : April 27, 2004
INVENTOR(S) : Gurtej S. Sandhu et al.

It is certified that error appears in the above-identified patent and that said Letters Patent is hereby corrected as shown below:

Title page, Item [54] and Column 1, line 1,
Title, replace title with -- SEMICONDUCTOR PROCESSING METHODS OF FORMING AND UTILIZING ANTIREFLECTIVE MATERIAL LAYERS, AND METHODS OF FORMING TRANSISTOR GATE STACKS --

Title page,
Item [56], References Cited, U.S. PATENT DOCUMENTS,
Insert -- 6,124,641      9/2000  Matsuura --
Insert -- 6,284,677 B1   9/2001  Hsiao et al. --

FOREIGN DOCUMENTS, replace "WO   PCT/US99/20039   8/1999" with -- WO   PCT/US99/20029   8/1999 --

OTHER PUBLICATIONS, replace 5th publication cited with -- Matsuura, M. et al., "A Highly Reliable Self-Planarizing Low-k Intermetal Dielectric for Sub-quarter Micron Interconnects IEEE IEDM Tech. Dig., 1997, pp.785-788. --

Column 1,
Line 6, insert -- RELATED PATENT DATA --

Column 2,
Line 32, replace "$Si_xO_yN_2$.  In practice the layer can be substantially inorganic," with -- $Si_xO_yN_z$.  In practice the layer can be substantially inorganic, --

Column 4,
Line 52, replace "of material 60 during the anneal of suicide layer 58." with -- of material 60 during the anneal of silicide layer 58. --

UNITED STATES PATENT AND TRADEMARK OFFICE
CERTIFICATE OF CORRECTION

PATENT NO. : 6,727,173 B2
DATED : April 27, 2004
INVENTOR(S) : Gurtej S. Sandhu et al.

It is certified that error appears in the above-identified patent and that said Letters Patent is hereby corrected as shown below:

<u>Column 6,</u>
Line 67, replace "exposure of the temperature is at least bout 30 minutes." with -- exposure to the temperature is at least about 30 minutes. --

Signed and Sealed this

Twenty-eighth Day of September, 2004

JON W. DUDAS
*Director of the United States Patent and Trademark Office*